United States Patent [19]
Chiu et al.

[11] Patent Number: 5,985,092
[45] Date of Patent: Nov. 16, 1999

[54] ENDPOINT DETECTION SYSTEM

[75] Inventors: Ko-Wen Chiu, Taipei; Wen-Sheng Chien, Kaohsiung, both of Taiwan

[73] Assignee: United Microelectronics Corp., Hsin-Chu, Taiwan

[21] Appl. No.: 08/864,223

[22] Filed: May 28, 1997

Related U.S. Application Data

[60] Provisional application No. 60/033,113, Dec. 17, 1996.
[51] Int. Cl.[6] .............................. C23F 1/02; C23C 16/00
[52] U.S. Cl. ............................................ 156/345; 118/712
[58] Field of Search .................................... 118/712, 713, 118/714; 156/345; 204/298.03, 298.32

[56] References Cited

U.S. PATENT DOCUMENTS

| 4,883,560 | 11/1989 | Ishihara | 156/626 |
| 5,290,383 | 3/1994 | Koshimizu | 156/345 |
| 5,320,704 | 6/1994 | Horioka et al. | 156/626 |
| 5,626,714 | 5/1997 | Miyazaki et al. | 216/60 |
| 5,630,949 | 5/1997 | Lakin | 216/61 |
| 5,897,378 | 4/1999 | Eriguchi | 438/707 |

FOREIGN PATENT DOCUMENTS 61-206226  9/1986  Japan .

*Primary Examiner*—Bruce Breneman
*Assistant Examiner*—Luz Alejandro
*Attorney, Agent, or Firm*—Rabin & Champagne, P.C.

[57] ABSTRACT

A metal etching system has an etching chamber defined by quartz walls. Coils provided around the quartz walls of the etching chamber are used to apply a high frequency electrical field to at least a portion of the etching chamber. Containment walls are provided around the coils. An endpoint detection system is provided for the etching system which includes an optical fiber which extends through the containment wall and the coils, with an end of the optical fiber disposed in fixed relationship to the quartz walls of the etching chamber. A fixture mounts the optical fiber in the containment wall. An air-tight seal, such as an O-ring compressed around the optical fiber and compressed against the containment wall, is provided to limit air flow along the optical fiber to the surface of the etching chamber walls. The O-ring or similar air-tight seal prevents air from flowing from outside of the containment wall to the surface of the etching chamber wall which would otherwise locally cool the etching chamber walls and cause material to deposit onto the chamber walls.

11 Claims, 2 Drawing Sheets

ENDPOINT DETECTION SYSTEM

This application claims priority from provisional application Ser. No. 60/033,113, filed Dec. 17, 1996.

BACKGROUND OF THE INVENTION

1. Field of the Invention

The present invention relates to semiconductor processing and more particularly to systems for monitoring semiconductor processing steps.

2. Description of the Related Art

The manufacture of high density integrated circuit devices typically proceeds by repeating a sequence of processing steps which includes depositing a layer of material over a substrate, forming an etching mask on the surface of the deposited material, etching the deposited material to define a structure over the substrate, and then removing the etching mask. This sequence is repeated many times in the manufacture of a typical integrated circuit device. Due to the economics of the manufacture of integrated circuit devices, it is very desirable to minimize the time spent in individual processing steps and in the total time consumed for this sequence of processing steps. On the other hand, it is very desirable to complete each processing step in such a manner as to ensure that there are high yields from the manufacturing process. To this end, it has become increasingly common to incorporate systems for monitoring the progress of processing steps as an essential component of integrated circuit manufacturing equipment.

Etching processes are particularly amenable to the use of process monitoring techniques because of the often critical nature of the etching process and because of the presence of detectable byproducts of the etching process. A typical etching process is performed to remove the portion of a layer of deposited material that is exposed through the openings in an etching mask. Exposed material is generally removed using an anisotropic process to etch holes having substantially vertical walls aligned with the mask openings, with the etched holes extending all the way through the layer of deposited material. Material removed by the etching process is typically present in the etching chamber either within a gaseous end product of the etching process or as particulates. The progress of etching processes should result in changes in the composition of gases within the etching chamber during different portions of the etching process. For example, the fraction of chamber gases incorporating materials derived from the material being etched should increase as etching begins and should drop when the etching process is complete. Monitoring the presence within the etching chamber of reacted gas compounds incorporating the etched material can therefore provide an indication of the end of the etching process.

Different monitoring techniques are used for detecting the presence of gaseous byproducts of etching processes within the etching chamber or for otherwise monitoring the progress of a processing step. One of the more common process monitoring techniques is used to monitor the progress of plasma etching processes. Plasma etching processes can highly excite the elemental etched material (i.e., particulates) or the compounds incorporating reacted etched material so that these materials fluoresce or otherwise emit light at wavelengths that are characteristic of the etched material. By monitoring the intensity of fluorescence or characteristic emissions at these characteristic wavelengths, the etching process can be monitored. A drop in the intensity of fluorescence might, for example, indicate the completion of an etching process and so might be used as an endpoint detection tool.

Other process monitoring techniques are known. For example, instead of monitoring an emission that is characteristic of an etched material, light can be passed through the etch chamber to measure optical absorption on lines that are characteristic of the etched material or the byproducts of the etching process. An increase in absorption may be characteristic of the onset of etching and a decrease in absorption may be characteristic of the completion of etching. Still other techniques are know or could be used. Ellipsometric measurements are used to detect the thickness of films deposited onto workpieces and might be used to monitor the etching of thin, relatively uniform films. Reflectance measurements including reflectance spectroscopy can be used to detect the presence or absence of a film on the surface of a workpiece and so might be used for detecting the deposition of a film or removal of a film in an etching process. Each of these techniques could be used in an endpoint detection system.

A common feature of these process monitoring tools is the use of optical techniques to remotely sense the presence or absence of materials in the etching chamber. For at least some types of processing equipment, it is necessary to provide an optical path or optical viewing port to gain access to the processing environment to make such optical measurement techniques. Most processing systems are enclosed within chamber walls so that the processing chamber can be evacuated and provided with different gas environments as desired. While some of the processing chamber walls are formed from transparent materials such as quartz, it may be necessary to provide transparent windows through the chamber walls when optical monitoring is to be performed through walls that are not transparent. It may also be necessary to provide an optical path or viewing port through structures that are provided around the processing chamber. For example, in some plasma etching systems, the etching chamber is contained within electrical coils that are used for applying either a radio frequency (RF) electric field or a magnetic field to the interior of the etching chamber. An example of such a system is the Hitachi 308-ATE ECR Metal Etcher, which provides coils formed of hollow copper tubing around the quartz walls of the etching chamber. The copper coils are provided around the etching chamber to provide an RF field to the interior of the chamber, and completely surround parts of the chamber walls. To implement an endpoint detection system for this metal etcher, it is most convenient to provide an optical fiber through the coils to a fixed position adjacent the quartz chamber wall so that the fiber images at least a portion of the etching chamber. Sensing operations can then be performed through the optical fiber to facilitate operation of an endpoint detection system.

SUMMARY OF THE PREFERRED EMBODIMENTS

An aspect of the present invention provides an etching system having an etching chamber defined by an etching chamber wall, the etching chamber wall enclosing at least one fixture for holding a substrate during an etching process. The etching chamber wall encloses a region adjacent the at least one fixture into which an etchant is provided. An outer chamber having an outer chamber wall at least partially encloses the etching chamber and has an optical access port provided in the outer chamber wall. The optical access port includes a mounting structure for holding an optical element in fixed relationship to the inner chamber wall and the outer chamber wall. The etching system also includes a means for providing an airtight seal between the outer chamber wall and an optical element.

In a particular embodiment of this aspect of the invention, the mounting structure comprises a set of male threads and a set of female threads corresponding to the set of male threads, and the means for providing an airtight seal comprises an O-ring that compresses in response to rotation of the male threads with respect to the female threads so that the compressed O-ring makes contact with the outer chamber wall and an optical element.

In a different embodiment of this aspect of the invention, the etching system includes an optical fiber which passes through the outer chamber wall to a position adjacent but spaced from the etching chamber wall.

Another aspect of the invention provides an etching system having an etching chamber defined by an etching chamber wall, where the etching chamber wall encloses at least one fixture for holding a substrate during an etching process. The etching chamber wall also encloses a region adjacent the at least one fixture into which an etchant is provided during an etching operation. A containment wall at least partially encloses the etching chamber and includes an optical access port provided in the containment wall. A mounting structure holds an optical element in fixed relationship to the etching chamber wall. An optical element, which carries an optical signal indicative of an etching condition within the etching chamber, extends through the optical access port in the outer containment wall. A body of compressible material is in contact with the optical element and the mounting structure.

DETAILED DESCRIPTION OF THE PREFERRED EMBODIMENTS

Figure 1:
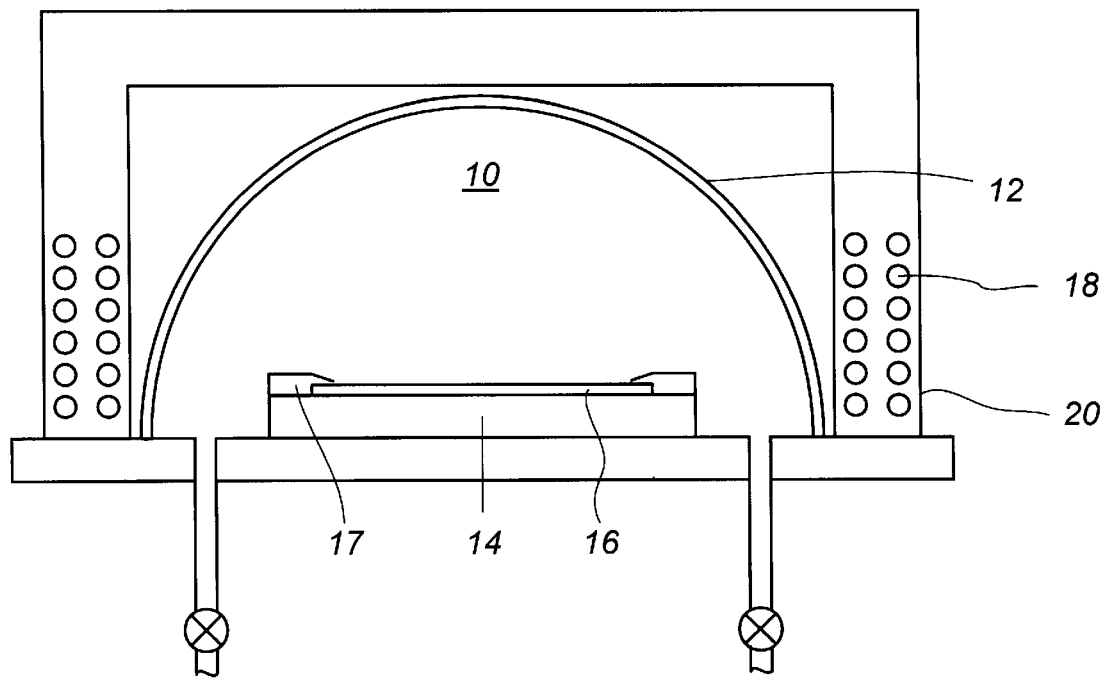
FIG. 1 schematically illustrates in elevation view an etching system.

One aspect of the present invention provides an improved etching system in which the walls of the etching system have a more uniform temperature. Many etching systems include endpoint detection systems for optically identifying the completion of an etching step. A particularly useful configuration of an endpoint detection system includes an optical fiber that images a portion of the etching chamber and acts as an optical probe for monitoring the etching process. The present inventors have noted that the optical fiber probe of the endpoint detection system can act as a "cold finger" which locally cools a surface of the etching chamber. Localized cooling of the wall of the etching chamber can result in the redeposition of material etched from an etch substrate onto the walls of the chamber. Because the deposition of material onto the walls of the etching chambers is localized at the cool spot on the wall of the etching chamber through which the chamber is imaged by the optical fiber, the operation of the endpoint detection system is particularly sensitive to this redeposition process. The inventors believe that the dominant mechanism for this undesirable localized cooling is air flow channeled along the optical fiber, or at least passing through the mechanical coupling between the optical fiber and the walls of a containment chamber that surrounds the etching chamber.

Typically, etching chambers are enclosed within containment walls separate from the walls that define the etching chambers to physically protect the etching chamber and the coils provided around the etching chamber. The space between the containment walls and the walls of the etching chamber is typically maintained at atmospheric pressure. The optical fiber probe of the endpoint detection system passes through the containment wall and the end of the optical fiber is held in a fixed position adjacent the wall of the etching chamber by a mounting system attached to the containment system wall. Generally, a sleeve is provided around the optical fiber which passes through the containment walls and between the coils to protect the fiber from the coils. Many times, the entire length of the optical fiber is enclosed within a sleeve. Preferred embodiments of the present invention provide an improved endpoint detection system which reduces undesirable localized cooling of the walls of the etching chamber, improving the temperature uniformity of the walls of etching chambers which use endpoint detection systems. This is accomplished by limiting the amount of air flow to the surface of the etching chamber that can contribute to the convective heat transfer along the optical probe. This may simply be done by providing a piece of rubber or a similar resilient material between the optical fiber and the sleeve or the containment well to form an airtight seal between the optical fiber and the sleeve or the containment wall. Alternately, but less desirably, the air tight seal might be provided by epoxy holding the fiber against the containment wall.

FIG. 1 schematically illustrates an electron cyclotron resonance etcher which might be, for example, the Hitachi 308-ATE metal etching system or a similar etching system. The etching chamber 10 of the etcher is enclosed at the top by a quartz bell jar 12. Inside of the bell jar is a susceptor 14 that helps to maintain a workpiece mounted on the susceptor at a constant temperature during etching. Note that, while the following discussion focuses on the etching of structures above a silicon substrate in the manufacture of integrated circuit devices, the illustrated etching system might also be used to etch other structures, including flat panel displays. A silicon wafer 16 is held on the surface of the susceptor 14 by clamps 17 which have small fingers extending over and pressing down on a peripheral portion of the wafer to hold the wafer against the susceptor 14. Other mounting systems including electrostatic chucks are known for holding wafers within etching systems. During etching operations, the inner chamber 10 within the quartz bell jar 12 is evacuated to a moderate to high vacuum depending on the particular type of etching operation to be performed. Etchant gas compounds or excited species of etchant gases are introduced into the inner chamber during the etching process. Coils 18 are wound around the walls of the quartz bell jar 12 for applying an electric or magnetic field to the inner chamber to either excite an etchant or to control the properties of an excited etchant that is excited in another part of the etching system and provided to the etching chamber 10.

The coils 18 typically consist of copper or other low resistivity metal tubing wrapped in a shallow spiral around the quartz bell jar. Generally, the coils are hollow and the hollow portions of the coils define a single fluid circulation path for a refrigerant such as water that flows through the coils constantly during operation. The ends of the coils are attached to fittings that pass through the outer containment wall 20 and the coils are connected through the fittings to tubing or other leads that connect the coils to a high frequency (RF, radio frequency) power supply. Containment walls 20 provided around the coils 18 serve several purposes: (1) Protecting the coils from contact with external structures which could short coils together; (2) Enclosing the coils, preventing a catastrophic failure of the coils from damaging surrounding equipment; and (3) Providing at least some electromagnetic shielding. All of these functions can be adequately performed if the space between the bell jar and the outer containment wall is maintained at atmospheric pressure and so it is preferred that this space be maintained at atmospheric pressure in most implementations.

Etching operations proceed by introducing or exciting a plasma of an etchant gas or gases above the substrate to be etched. The progress of an etching operation can be monitored by tracking either characteristic emissions or absorptions from the materials produced by etching the surface of the workpiece. Other processes, including those listed in the background of this specification, might also be used for detecting the end of a process step. Optical techniques where the endpoint of an etching process is identified by detecting a variation in an optical signal are preferably used in embodiments of this invention to monitor the etching process. Such optical detection techniques are particularly well suited to the illustrated etching system, because the large electric field used to generate or control the plasma would interfere with any electrical conduction based probing technique.

Figure 2:
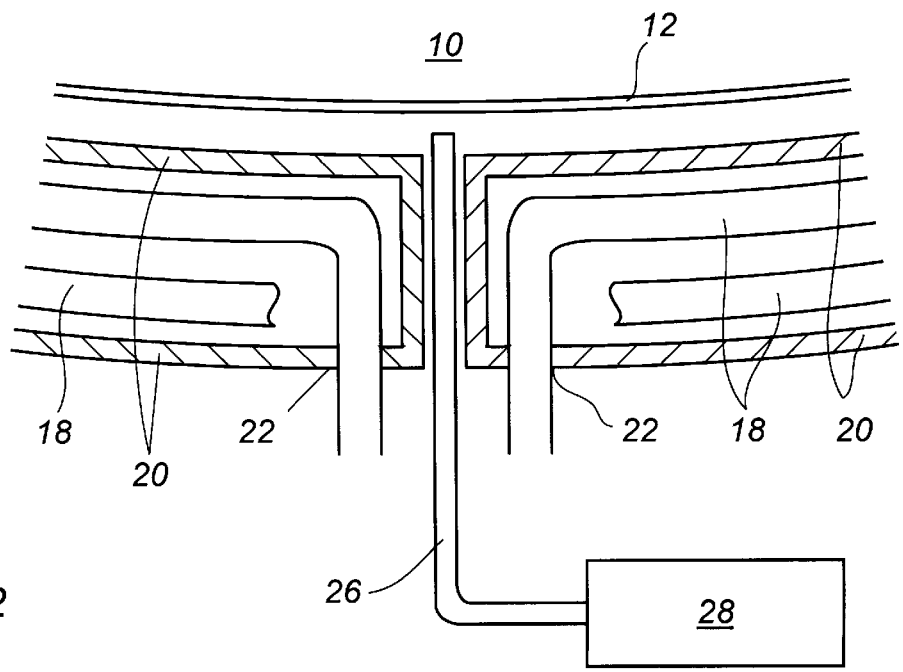
FIG. 2 schematically illustrates in plan view an etching system including an endpoint detection system.

A configuration of an optical fiber probe for an endpoint detection system within the FIG. 1 etching system is shown in greater detail in FIG. 2. Referring to FIG. 2, a portion of a silicon wafer 16 on which structures are formed which will undergo an etching process is illustrated in plan view within the etching chamber 10 and surrounded by the quartz wall 12 of the etching chamber. Portions of the coils 18 are shown enclosed within inner and outer containment walls 20 and coiling around the etching chamber within the walls 20. Feed throughs 22 are provided through the outer containment wall to connect the coils to the refrigerant circulation system and to the high frequency power supply. In a preferred embodiment of the present invention, an opening is provided through the containment walls 20 between the feedthroughs to provide optical access through the containment walls to the wall 12 of the etching chamber. A fitting is provided that holds the optical fiber in fixed relationship to the containment wall so that an end of the fiber is adjacent the etching chamber wall and images a portion of the interior of the etching chamber. A cylindrical sleeve 24 extends through the coils between the inner and outer containment walls, and optical fiber 26 extends from the sleeve 24 at a position that has optical access to the interior of the etching chamber. The present etching system, primarily intended for etching metals, uses transparent walls, and so there is no need to provide a port through the etching chamber walls. The end of the optical fiber 26 is positioned so that the optical fiber images a portion of the etching chamber, typically above the surface of wafer 16. It may be desirable to provide a lens or other optical elements in association with the end of the optical fiber to collect light to improve the efficiency of the endpoint detection system. Such optical elements would typically be mounted on the inner containment wall 20. The optical signal collected through the etching chamber wall 12 from the interior 10 of the etching chamber passes through the optical fiber 26 and is provided to optical detectors and signal processing circuitry within the endpoint detection system 28.

The inventors have observed after an etching process that etch material (more properly, the chemical end products of etching) is sometimes deposited on the inner surface of the etching chamber walls, with the deposition localized adjacent the position of the optical fiber probe of the endpoint detection system. Typically, etch materials are locally redeposited at cold spots on the walls of the etching chamber. This observation suggested to the present inventors that the fiber optic probe 26 of the endpoint detection system is acting like a cold finger adjacent the wall 12 of the bell jar. Due to the insulating nature of the optical fiber, conductive heat flow along the optical fiber probe is expected to be very low. It is therefore unlikely that thermal conduction is sufficient to produce the observed local cooling of the etching chamber wall 12. On the other hand, the mechanical fitting conventionally provided between the containment wall and the optical fiber can allow air to flow from outside of the containment wall toward the surface of the bell jar. The present inventors believe that air flow along the optical fiber probe is the source of the localized cooling that causes the observed localized deposition on the walls of the bell jar.

Figure 3:
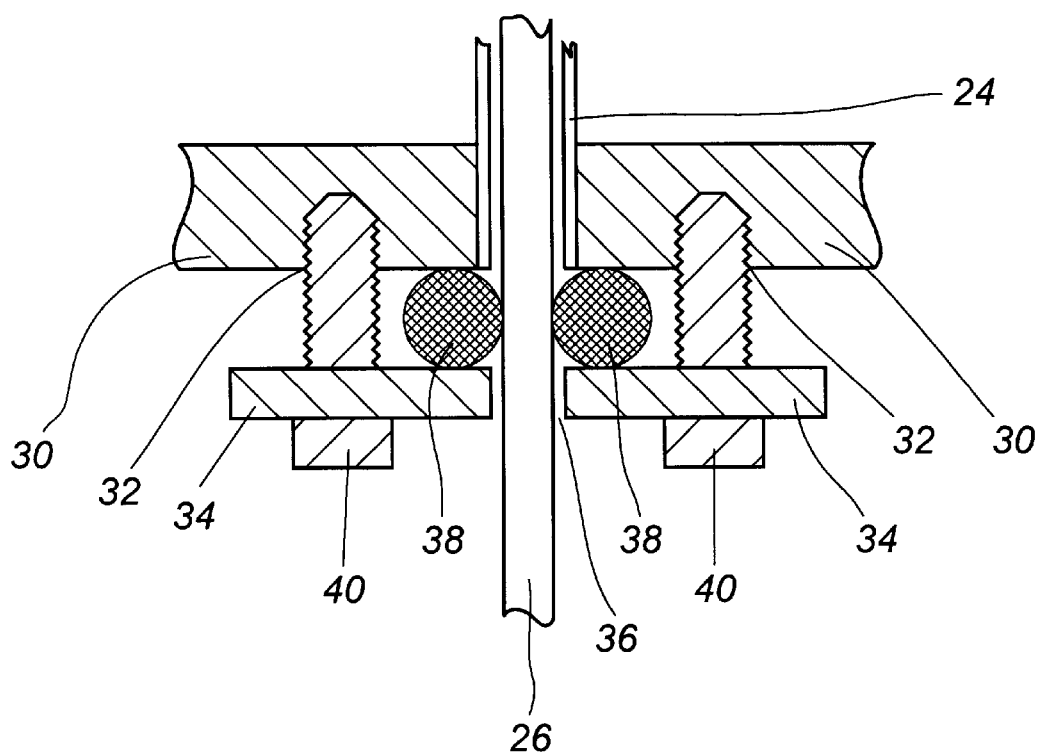
FIG. 3 provides a close up view of a portion of an endpoint detection system.

To address this cooling mechanism, the mounting for the optical fiber of an endpoint detection system in accordance with the present invention is preferably fashioned to limit the flow of air from outside the containment wall toward the surface of the quartz bell jar. This might be accomplished by, for example, using an epoxy mounting between the optical fiber and either the inner or the outer containment wall. Such a rigid mounting, while in most respects suitable, does not allow for the optical fiber to easily be removed from its mounting. This may be inconvenient when servicing the etching system. Similarly, providing a mounting on the outer containment wall makes it easier to assemble and service the endpoint detection system. Accordingly, a more preferred mounting, which can be disassembled and reused, is preferably provided between the optical fiber and the outer containment wall. An appropriate structure is illustrated in FIG. 3. The mounting structure includes a first mounting plate 30 attached to or a part of the containment wall 20. The first mounting plate is configured so that no air can flow through the mounting plate except near a through hole provided for the optical fiber. Bolt holes 32 are preferably provided in the first mounting plate 30. A second mounting plate 34 is provided having a central opening 36 through which the optical fiber 26 can pass and holes through which bolts, corresponding to the holes in the first mounting plate, can pass. An O-ring 38 having a relaxed inner diameter approximately the same or slightly smaller than the outer diameter of the optical fiber 26 is provided between the first mounting plate 30 and the second mounting plate 34, and the optical fiber passes through the respective openings in the first and second mounting plate and the O-ring 38. In the illustrated embodiment, a bare optical fiber 26 is shown within the endpoint detection system. In other embodiments, the optical fiber 26 might have one or more layers of cladding, protective jackets or similar coatings thereon which are in contact with the O-ring 38. Bolts 40 are threaded through the second mounting plate into the corresponding holes in the first mounting plate and the bolts are tightened to compress the O-ring. The O-ring flattens, forming an airtight or hermetic seal both with the optical fiber 26 and the first mounting plate 30 and so with the outer containment wall, significantly restricting the air path the inventors believe to be responsible for the undesirable localized cooling of the walls of the etching chamber. A seal such as that illustrated in FIG. 3 is often airtight to significant vacuum levels, but a vacuum-tight seal is not necessarily needed to benefit from the practice of the present invention. Other, similarly successful seal structures are known, particularly in the arts which pass tubes and electrical feeds through walls separating atmospheric pressure regions from low to moderate vacuum regions. Generally, other useable seal structures will also incorporate a resilient material such as rubber. Single use seals could be formed out of materials that are merely compressible, rather than resilient, and might include a crushable metal like indium. In particularly preferred embodiments, the O-ring is formed of Viton™, because of the durability of the material and the wide temperature range over which Viton can be used.

It is not necessary to provide a collar around the outside of the O-ring to ensure a sufficiently airtight joint, but it may be desirable to use a collar that limits the extent to which the O-ring can be compressed to prevent excessive pressure against the optical fiber. In practice, some configurations of seals may utilize a compression seal in which the first mounting plate has a single set of male or female threads that surround both the optical fiber and the O-ring. In such a case, the second mounting plate will have the complementary female or male thread type around its periphery. If the second mounting plate has female threads, for example, then the second mounting plate would be similar to a nut having a through hole provided for the optical fiber.

Reaction systems, whether they are deposition systems or etching systems, are sensitive to variations in temperature on the walls of the containment chamber. The walls of an etching chamber may be cooled to prevent chemical reactions near or at the walls. Additionally, the walls of an etching chamber may be cooled to protect electrical circuitry such as sensors or fittings including electrical, gas or coolant feedthroughs. Other etching chambers desirably have heated walls, for example, to prevent material from depositing on the walls of the etching chamber. Whatever temperature is intended for the walls of a chamber, uniformity of the wall temperature is important, particularly when optical means are provided for monitoring the progress of a processing step. Accordingly, it is to be understood that variations on the present invention would find applicability in other monitoring systems used with processing equipment.

The present invention has been described with emphasis on particularly preferred embodiments thereof. Those of ordinary skill in the art will appreciate that variations and modifications might be made to the present invention without varying from the basic teachings thereof. The scope of the present invention is therefore to be determined from the following claims.

What is claimed:

1. An etching system comprising:
   an etching chamber defined by an etching chamber wall, the etching chamber wall enclosing at least one fixture for holding a substrate during an etching process, the etching chamber wall enclosing a region adjacent the at least one fixture into which an etchant is provided;
   an outer chamber having an outer chamber wall, the outer chamber at least partially enclosing the etching chamber;
   an optical access port provided in the outer chamber wall, the optical access port including a mounting structure for holding an optical element in fixed relationship to the etching chamber wall and the outer chamber wall; and
   means for providing an airtight seal between the outer chamber wall and an optical element.

2. The etching system of claim 1, wherein the means comprises a body of compressible material.

3. The etching system of claim 1, wherein the mounting structure comprises a set of male threads and a set of female threads corresponding to the set of male threads, and
   wherein the means for providing an airtight seal includes an O-ring that compresses in response to rotation of the male threads with respect to the female threads so that the compressed O-ring makes contact with the outer chamber wall and an optical element.

4. The etching system of claim 3, further comprising an optical fiber pass through the outer chamber wall to a position adjacent but spaced from the inner chamber wall.

5. The etching system of claim 1, wherein the etching chamber is coupled to a pumping system for establishing a subatmospheric pressure in the etching chamber during an etching process and wherein the space between the etching chamber and the outer chamber is maintained at approximately atmospheric pressure during etching operations.

6. The etching system of claim 1, further comprising:
   a coil around the etching chamber for providing an electric field to the etching chamber, the coil enclosed by the outer chamber wall; and
   first and second electrical feedthrough fixtures coupled to ends of the coil, the first and second feedthrough fixtures provided through the outer chamber wall, wherein coolant for the coil circulates through the first and second electrical feedthrough fixtures.

7. An etching system comprising:
   an etching chamber defined by an etching chamber wall, the etching chamber wall enclosing at least one fixture for holding a substrate during an etching process, the etching chamber wall enclosing a region adjacent the at least one fixture into which an etchant is provided during an etching operation;
   a containment wall at least partially enclosing the etching chamber;
   an optical access port provided in the containment wall;
   a mounting structure for holding an optical element in fixed relationship to the etching chamber wall;
   an optical element extending through the optical access port in the outer containment wall, the optical element for passing through the containment wall an optical signal indicative of an etching condition within the etching chamber; and
   a body of compressible material in contact with the optical element and the mounting structure.

8. The etching system of claim 7, wherein the optical element is an optical fiber.

9. The etching system of claim 8, wherein the mounting structure comprises a set of male threads and a set of female threads corresponding to the set of male threads, and wherein the body of compressible material is compressed in response to rotation of one set of threads against the other set of threads.

10. The etching system of claim 9, wherein the body of compressible material is an O-ring.

11. The etching system of claim 7, wherein the body of compressible material forms an airtight seal between the optical element and the containment wall.

* * * * *